(12) United States Patent
Ahn et al.

(10) Patent No.: US 6,528,361 B1
(45) Date of Patent: Mar. 4, 2003

(54) PROCESS FOR PREPARING A POLYCRYSTALLINE SILICON THIN FILM

(75) Inventors: Byung-Tae Ahn, Taejon (KR); Do-Kyung Kim, Taejon (KR); Jong-Hee Kim, Taejon (KR); Jeong-No Lee, Seoul (KR); Yoon-Chang Kim, Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/639,212

(22) Filed: Aug. 14, 2000

Related U.S. Application Data

(63) Continuation of application No. 08/976,351, filed on Nov. 20, 1997, now abandoned.

(30) Foreign Application Priority Data

Nov. 20, 1996 (KR) .............................. 96-55647

(51) Int. Cl.$^7$ ................. H01L 21/0084; H01L 21/2036
(52) U.S. Cl. ...................... 438/166; 438/486; 438/487
(58) Field of Search ............................... 438/166, 487, 438/486

(56) References Cited

U.S. PATENT DOCUMENTS

| | | | |
|---|---|---|---|
| 4,303,455 A | * | 12/1981 | Splinter et al. |
| 4,474,625 A | * | 10/1984 | Cohen et al. |
| 5,179,073 A | | 1/1993 | Yamazaki |
| 5,529,937 A | | 6/1996 | Zhang et al. |
| 5,543,352 A | | 8/1996 | Ohtani |
| 5,585,291 A | | 12/1996 | Ohtani |
| 5,595,944 A | | 1/1997 | Zhang et al. |
| 5,854,096 A | | 12/1998 | Ohtani et al. |
| 6,172,322 B1 | * | 1/2001 | Shang et al. |

OTHER PUBLICATIONS

Beyers, et al., "Oxygen ordering, phase separation and the 60-K and 90-K plateaus in Yba$_2$Cu$_3$O$_x$," *Nature*, vol. 340, No. 6235, pp. 619–621, Aug. 1989.

Ahn, et al., "Quaternary Phase Relations Near YBa$_2$Cu$_3$O$_{6+x}$ at 850° C in Reduced Oxygen Pressures," *Physica* C 167 (1990) pp. 529–537.

Lee, et al., "Microwave-induced low-temperature crystallization of amorphous silicon thin films," *J. Appl. Phys.*, 82 (6), Sep. 15, 1997.

Lee, et al., "Variations of morphology and electrical property of diamond with doping using diborane in a methane-hydrogen gas mixture," *Diamond and Related Materials*, 8 (1999) 251–256.

Recrystallization of amorphized polycrystalline silicon films on SiO$_2$: Temperature dependence of the crystallization parameters, R.B. Iverson and R. Reif, J. Appl. Phys. 62(5), pp. 1675–1681, Sep. 1, 1987.

Effect of substrate temperature on recrystallization of plasma chemical vapor deposition amorphous silicon films, Kenji Nakazawa and Keiji Tanak, J. Appl. Phys. 68(3), pp. 1029–1032, Aug. 1, 1990.

(List continued on next page.)

Primary Examiner—John F. Niebling
Assistant Examiner—Ron Pompey

(57) ABSTRACT

The present invention relates to a process for preparing a polycrystalline silicon thin film comprising a step of microwave annealing and crystallization of an amorphous thin film of silicon semiconductor, silicon semiconductor added with impurities, IV family semiconductor comprising Si alloy such as $Si_{1-x}Ge_x$, III-V family and II-VI family semiconductor. The process for preparing polycrystalline silicon thin film of the present invention comprises the steps of: immersing a washed substrate into a deposition equipment and heating the substrate; depositing an amorphous or microcrystalline silicon thin film on the substrate; and, annealing the deposited thin film employing microwave for crystallization.

20 Claims, 4 Drawing Sheets

OTHER PUBLICATIONS

Pd induced lateral crystallization of amorphous Si thin films, Seok–Woon Lee, et al., Appl. Phys. Lett. 66(13), pp. 1671–1672, Mar. 27, 1995.

Low–Temperature crystallization of Amorphous Si Films by Metal Adsorption and Diffusion, Dong Kyun Sohn, et al., J. Appl. Phys., vol. 35, pp. 1005–1009, Part 1, No. 2B, Feb. 1996.

* cited by examiner

PROCESS FOR PREPARING A POLYCRYSTALLINE SILICON THIN FILM

This application is a continuation of prior application Ser. No. 08/976,351, filed Nov. 20, 1997, now abandoned.

FIELD OF THE INVENTION

The present invention relates to a process for preparing a polycrystalline silicon thin film, more specifically, to a process for preparing a polycrystalline thin film comprising a step of microwave annealing and crystallization of an amorphous thin film of silicon semiconductor, silicon semiconductor added with impurities, IV family semiconductor comprising Si alloy such as $Si_{1-x}Ge_x$, III-V family and II-VI family semiconductor.

BACKGROUND OF THE INVENTION

In recent years, a variety of processes for obtaining polycrystalline thin film on amorphous substrate have been suggested in the art, to meet the requirement of polycrystalline thin films to be applied to polycrystalline silicon (poly-Si) thin film transistor("TFT") for SRAM, TFT for LCD, solar cell, SOI device, etc. Particularly, attempts to obtain polycrystalline thin film under a low temperature, which is critical factor for the consideration of solar cell or TFT for LCD employing glass as a substrate, have been tried as followings:

Japanese patent laid-open publication (Sho) 4-144122 and (Sho) 3-25633 disclose a process for fabricating polycrystalline thin film by depositing amorphous thin film on a substrate and then crystallizing by way of annealing at a relatively high temperature of about 600° C., in accordance with low-pressure chemical vapor deposition(LPCVD) method.

Inverson et al. also teaches a process for fabricating crystalline thin film with increased grain size by depositing polycrystalline thin film on a substrate, implanting impurities to have amorphous characteristics, and finally annealing at a temperature of about 600° C.(see: R. B. Inverson et al., J. Appl. Phys., 65:1675(1987)).

Furthermore, Nakazawa et al. reports that polycrystalline thin film may be fabricated by depositing amorphous thin film on a substrate employing $Si_2H_6$ and then, annealing at a temperature of about 600° C., in accordance with plasma enhanced chemical vapor deposition(PECVD) method(see: Nakazawa et al., J. Appl. Phys., 68:1029(1990)).

The prior art methods are, however, proven less satisfactory in the senses that: low-priced glass cannot be employed as a substrate, since a high temperature of above 600° C. is essentially required to crystallize amorphous thin film; a step of implantation of impurities is also accompanied; and, expensive gas such as $Si_2H_6$ is needed, all of which increase the costs for manufacturing process.

As an approach to overcome the problems in the art, an annealing method which employs laser to crystallize through melting, after deposition of thin layer is made in accordance with PECVD or LPCVD method, has been provided. However, this method has also revealed shortcomings that: high cost is required for facilities of manufacturing and films of uniform thickness can be hardly achieved.

On the other hand, a process for obtaining polycrystalline thin film by depositing metals such as copper, gold and platinum as impurities to thin film, has been suggested in the art(see: D. K. Sohn et al., Jpn. J. Appl. Phys., 35:128(1996); S. W. Lee et al., Appl. Phys. Lett., 66:1571(1995)). Although this method permits the use of glass substrate due to the lowered temperature for crystallization, it has also revealed a problem that metals used for crystallization remain inside of polycrystalline thin film as impurities which in turn deteriorates the characteristics of device.

Accordingly, there are strong reasons for exploring and developing an alternative means for preparing a polycrystalline silicon thin film in an economical and simple manner.

SUMMARY OF THE INVENTION

In this regard, the present inventors have made an effort to develop an improved method for fabricating a polycrystalline silicon thin film, and provided a novel process which successfully tides over the said problems by employing a step of microwave annealing for crystallization. In accordance with the process of the invent-ion, efficient and economical fabrication of homogenous polycrystalline thin film can be realized, since it employs microwave annealing of amorphous thin film by which crystallization temperature can be lowered to a degree that allows the use of glass as a substrate.

A primary object of the present invention is, therefore, to provide a process for preparing a polycrystalline silicon thin film employing microwave, which allows crystallization at a low temperature.

BRIEF DESCRIPTION OF DRAWINGS

The above and the other objects and features of the present invention will become apparent from the following description given in conjunction with the accompanying drawings, in which.

DETAILED DESCRIPTION OF THE INVENTION

A process for preparing a polycrystalline silicon thin film of the present invention comprises the following steps:

Step 1: Immersion and Heating of Substrate

A substrate is washed and immersed into a deposition equipment and heated to reach to a temperature needed for deposition. At this time, the substrate heating temperature (hereinafter referred to as "deposition temperature") is set to a temperature of 100 to 400° C., which is necessary for carrying out conventional LPCVD or PECVD method.

Step 2: Deposition of Thin Film

Amorphous or microcrystalline silicon thin film is deposited on the substrate in accordance with the conventional LPCVD or PECVD method. In this regard, deposition pressure and thickness can be varied depending on the usage of thin film, since they are determinant factors of electrical characteristics or crystalline direction of the thin film.

Step 3: Annealing and Crystallization of Thin Film

Amorphous or microcrystalline thin film thus deposited is heated and annealed by employing a microwave furnace for crystallization. At this time, microwave annealing is preferably carried out at a temperature range of 400 to 600° C. for 2 to 5 hours.

As the other preferred embodiment of the invention, the process may further comprises a step of implanting impurities or depositing metals on the thin film, or both of said two steps, depending on the usage of crystallized thin film, prior to crystallization of the deposited amorphous or microcrystalline thin film, whose main purpose is to change electrical characteristics or crystalline structure of the deposited thin film.

Figure 1:
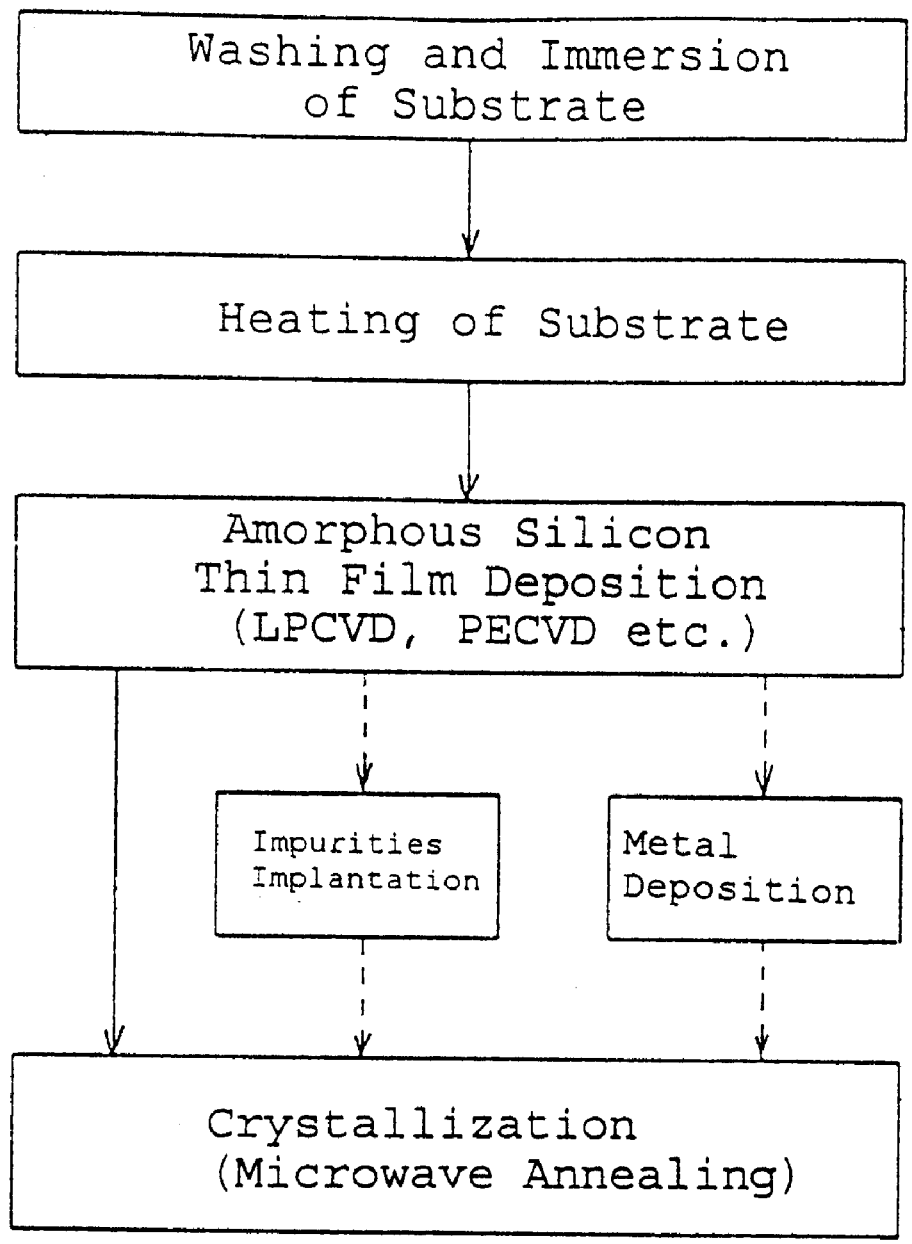
FIG. 1 is a schematic diagram depicting a process for preparing a polycrystalline thin film of the present invention.

The process for preparing a polycrystalline silicon thin film of the invention is schematically depicted in FIG. 1.

The present invention is further illustrated in the following examples, which should not be taken to limit the scope of the invention.

EXAMPLE 1

Amorphous silicon thin film was deposited on $SiO_2$/Si wafer by a conventional plasma enhanced chemical vapor deposition (PECVD) method, where deposition temperature was set to a temperature range of 100 to 400° C. with an interval of 100° C. and deposition pressure was controlled as 0.4 Torr. A source gas of 20% $SiH_4$ gas diluted with argon was flowed at a rate of 150 sccm so that it can be deposited with a thickness of 1,000 Å. The amorphous silicon thin film thus deposited was crystallized employing a multi-mode microwave furnace.

Figure 2:
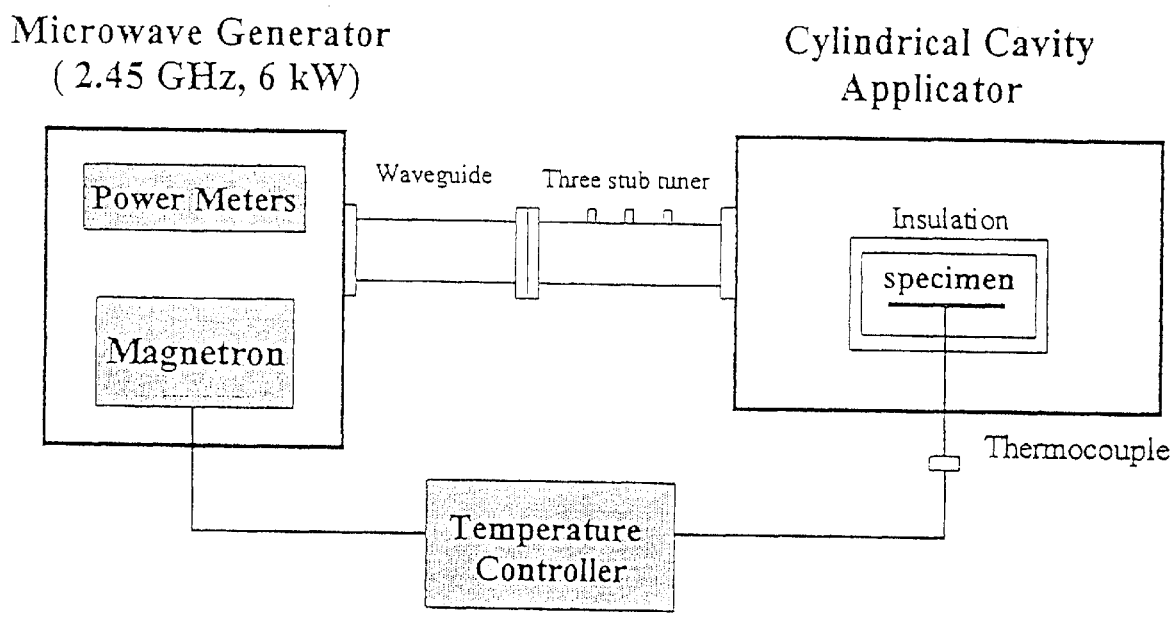
FIG. 2 is a schematic diagram showing a microwave furnace used in the invention.

Referring to FIG. 2, a schematic diagram of microwave furnace used in crystallization is provided. In the microwave furnace, temperature was controlled in an accuracy of ±1° C. by employing a temperature controller and a thermocouple positioned under a Si wafer. Annealing temperature was elevated to 550° C. at a rate of 20° C./min and then, maintained for 3 hours for crystallization. Microwave output employed for temperature elevation was below 1 kW, while forward power at an annealing temperature of 550° C. was 600 W and reflected power was 150 W. Annealing was conducted under an environment of $N_2$ gas.

Figure 3:
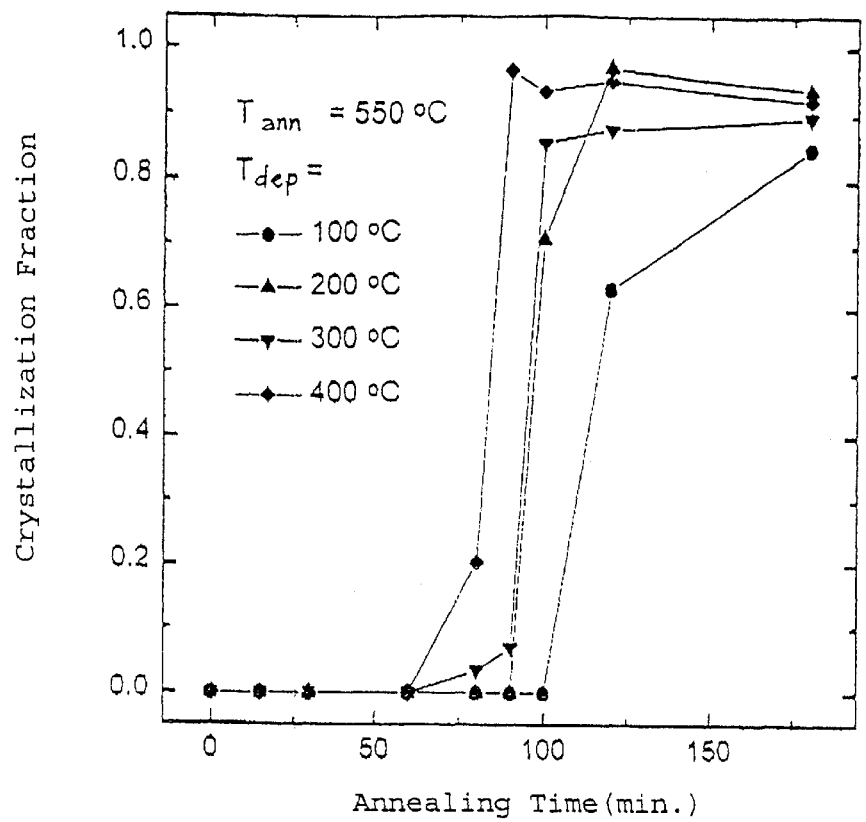
FIG. 3 is a graph showing crystallization behavior in the course of annealing of amorphous silicon thin film in accordance with Example 1.

FIG. 3 is a graph showing X-ray diffraction pattern of the polycrystalline silicon thin film fabricated in accordance with the above method. In FIG. 3, crystallization behavior is represented as crystalline fraction which is resulted from annealing at a temperature of 550° C., depending on the change of deposition temperature from 100 to 400° C. As shown in FIG. 3, complete crystallization was achieved after 2 or 3 hours even under a low annealing temperature.

EXAMPLE 2

After deposition of amorphous silicon thin film by PECVD method was made, copper was additionally deposited on the amorphous silicon thin film employing spin coating method. A polycrystalline silicon thin film was fabricated analogously as in Example 1, except that deposition of the thin film was carried out at a temperature of 200° C.

Figure 4:
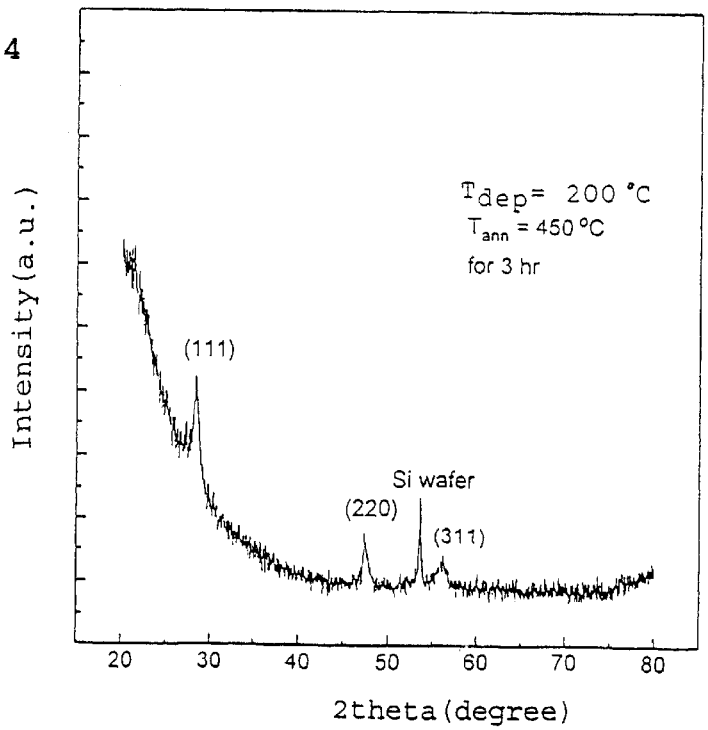
FIG. 4 is a graph showing X-ray diffraction pattern of polycrystalline silicon thin film fabricated in accordance with Example 2.

Amorphous silicon thin film further deposited with copper was annealed for 3 hours employing a microwave furnace used in Example 1. X-ray diffraction pattern of the silicon thin film annealed in accordance with the method is provided in FIG. 4. As shown in FIG. 4, crystallization proceeded to a considerable extent, even though annealing was carried out at a relatively low temperature of 450° C. for 3 hours, which indicates that annealing temperature fairly decreased by the deposition of metal on the silicon thin film.

Accordingly, it was clearly demonstrated that crystallization, unlike prior methods, proceeds in a short period at a low annealing temperature, since a microwave furnace is employed for crystallization in the present invention.

Comparative Example 1

Figure 5:
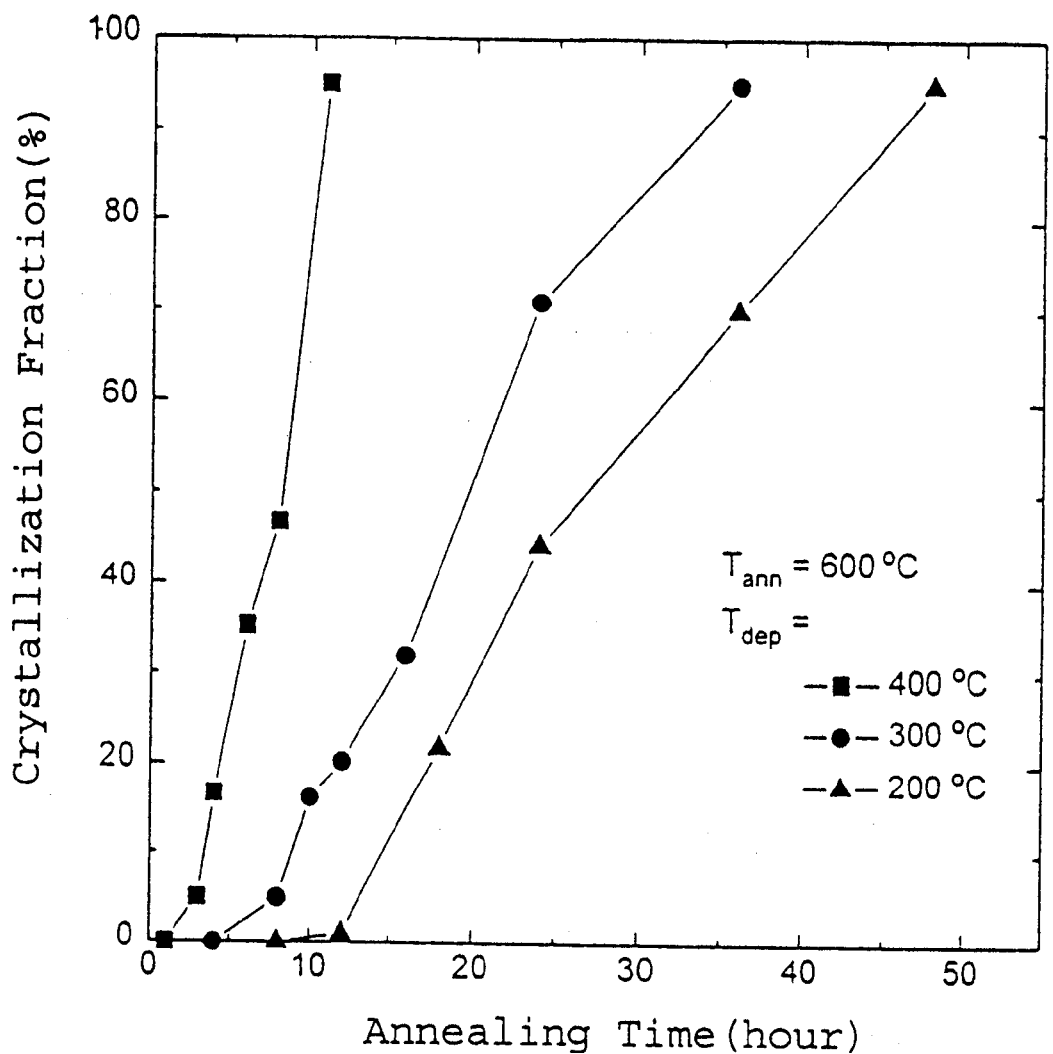
FIG. 5 is a graph showing crystallization behavior in the course of annealing of amorphous silicon thin film according to the conventional method.

In order to compare the present invention with the conventional method, amorphous silicon thin film was deposited in an analogous manner as in Example 2, and crystallized by the conventional method in the art. FIG. 5 is a graph showing a crystallization behavior at an annealing furnace of a temperature of 600° C., when the deposited thin film was annealed in accordance with the conventional method.

Referring to FIG. 5, it was clearly demonstrated that: when annealing was conducted at a temperature of 600° C., complete crystallization was achieved only after about 48 hours, under a deposition temperature of 200° C. This result presents a significant contrast to the present invention by which crystallization can be made at a relatively low temperature in a short period, e.g., annealing and crystallization can be achieved at 550° C. in about 3 hours(see: FIG. 3).

As clearly illustrated and demonstrated as above, a process for preparing a polycrystalline silicon thin film of the invention has a distinction over the conventional methods as followings:

(i) manufacturing cost can be reduced by employing a substrate of glass instead of an expensive quartz, since annealing temperature can be lowered to a degree that allows the use of glass as a substrate;

(ii) time needed for crystallization of amorphous thin film can be dramatically shortened, since microwave annealing is made in a short period;

(iii) even a specimen with a wide area can be equally heated, since microwave annealing makes the specimen itself to generate heat; and, (iv) generation of heat on the specimen naturally requires less energy, which affords high efficiency of the process.

Accordingly, in accordance with the present invention, polycrystalline thin films applied in TFT, solar cell, SOI device, etc., can be made in an economical and simple manner.

Although the preferred embodiments of the present invention have been disclosed for illustrative purpose, those who are skilled in the art will appreciate that various modifications, additions and substitutions are possible, without departing from the scope and spirit of the invention as disclosed in the accompanying claims.

What is claimed is:

1. A process for preparing a polycrystalline silicon thin film which comprises:

heating a substrate to reach a temperature of 100 to 400° C.;

depositing an amorphous or microcrystalline thin film on the substrate; and annealing the deposited thin film by a method essentially consisting of radiating microwave energy to the silicon thin film so as to crystallize or further crystallize the silicon thin film into a polycrystalline structure.

2. The process for preparing a polycrystalline silicon thin film of claim 1, which further comprises changing electrical characteristics of the deposited thin film prior to the annealing of the amorphous or microcrystalline thin film.

3. The process for preparing a polycrystalline silicon thin film of claim 2, wherein the changing electrical characteristics of crystalline structure comprises implanting impurities into the amorphous or microcrystalline thin film.

4. The process for preparing a polycrystalline silicon thin film of claim 2, wherein the changing electrical characteristics of crystalline structure comprises depositing metals on the amorphous or microcrystalline thin film.

5. The process for preparing a polycrystalline silicon thin film of claim 2, wherein the changing electrical characteristics of crystalline structure comprises implanting impurities into and depositing metals on the amorphous or microcrystalline thin film.

6. The process for preparing a polycrystalline silicon thin film of claim 1, wherein the annealing is carried out at a temperature range of 400 to 600° C.

7. A method of manufacturing a semiconductor film, comprising:
providing a glass substrate;
forming a semiconductor film on the substrate; and
annealing the deposited thin film by a method essentially consisting of radiating microwave energy to the semiconductor film so as to crystallize the semiconductor film into a polycrystalline structure.

8. The method as defined in claim 7, wherein the semiconductor film is deposited on the substrate by a chemical vapor deposition process.

9. The method as defined in claim 8, wherein the deposition is carried out at a temperature ranged from 100° C. to 400° C.

10. The method as defined in claim 7, wherein prior to the annealing the semiconductor film is in amorphous or microcrystalline phase.

11. The method as defined in claim 7, wherein the annealing is performed at a temperature ranged from 400° C. to 600° C.

12. The method as defined in claim 11, wherein the temperature is maintained for 2 to 5 hours.

13. The method as defined in claim 7, prior to the annealing further comprising implanting an impurity into the semiconductor film.

14. The method as defined in claim 7, prior to the annealing further comprising depositing a metal on the semiconductor film.

15. The method as defined in claim 7, wherein the semiconductor film comprises a silicon film.

16. A method of making an electronic device, comprising manufacturing a semiconductor film according to the method of claim 7, wherein the crystallized semiconductor film is further fabricated to produce one of the group consisting of TFT, solar cell and SOI device.

17. The method as defined in claim 7, wherein the radiation of microwave energy is conducted under an $N_2$ gas environment.

18. The process as defined in claim 1, wherein the radiation of microwave energy is conducted under an $N_2$ gas environment.

19. The process as defined in claim 6, wherein the temperature is maintained for 2 to 5 hours.

20. The method of claim 7, further comprising pre-heating the semiconductor film before the annealing.

* * * * *